Jan. 14, 1964 W. R. BELKO, JR 3,117,365

METHOD OF MAKING A STACKED CAPACITOR

Filed June 27, 1961

INVENTOR.
William R. Belko, Jr.
BY
Johnson and Kline
ATTORNEYS

United States Patent Office 3,117,365

Patented Jan. 14, 1964

3,117,365

METHOD OF MAKING A STACKED CAPACITOR

William R. Belko, Jr., Huntington, Conn., assignor to Vitramon, Incorporated, Monroe, Conn., a corporation of Delaware Filed June 27, 1961, Ser. No. 120,060
7 Claims. (Cl. 29—25.42)

This invention relates to a novel method of making capacitors. More specifically, it pertains to a method of making stacked capacitors embodying a plurality of capacitor units in superposed relation.

Prior to the present invention, stacked capacitors have been known in which there are a plurality of capacitor units bonded or otherwise held together to form the stack, each of the units including a wafer of dielectric material having electrodes, in the form of conductive areas, on opposite surfaces thereof. In such capacitors, in order to obtain accurate control over the electrical characteristics of the capacitor and/or eliminate short circuits between the electrodes, the conductive areas are formed in predetermined patterns on the wafers so that the electrodes on opposite surfaces of the wafers are electrically spaced relative to one another at their edges and each is electrically communicated to a different portion of the periphery of the wafer.

Heretofore, in making stacked capacitors each capacitor unit was made individually by forming electrically conductive areas, having a desired pattern, on opposite surfaces of a dielectric wafer in predetermined relation to one another and, thereafter, the individual units were assembled in a stack, with the patterns in required registration, to form the final capacitors. Because of the necessity of handling the small individual wafers and the subsequently formed capacitor units, as required in the prior art methods, problems were encountered which resulted in a high cost for the finished capacitor and a low level of reliability; the continuous handling of the individual wafers and the capacitor units, with the attendant disadvantage of breakage, was tedious and time consuming resulting in low yield and high cost. Further, the inaccuracies resulting from manually manipulating such small parts in the manufacture of the units and the subsequent assembly of the stacked capacitors produce an end product having doubtful reliability due to the faulty registration of the electrically conductive patterns in the stack.

The present invention overcomes the disadvantages of the prior art by providing an improved method for making stacked capacitors which eliminates the necessity of handling the small wafers and capacitor units, thus reducing the cost of the finished product and enhancing its reliability.

According to the invention, the improved method resides in the forming of a plurality of capacitor units in a sheet in juxtaposed relation and the stacking of sheets to provide superposed capacitor units forming a plurality of juxtaposed stacked capacitor assemblies adapted to be separated into individual stacked capacitors.

It is an object of the invention to provide a method of making stacked capacitors in which a plurality of identical predeterminately shaped electrically conductive electrode patterns are formed on one surface of a dielectric base member and a plurality of identical electrode patterns are formed on the opposite surface thereof, the latter patterns being oriented to lie in reverse position relative to the former so that, on stacking a plurality of base members one on top of another with identical correspondingly oriented patterns in engagement, a plurality of stacks of superposed electrode plates are provided in which alternate plates are in reverse position relative to one another.

It is also an object of the invention to provide a method of making stacked capacitors in which at least one basic electrically conductive pattern is formed on one surface of a dielectric base member, the basic pattern comprising a plurality of predeterminately shaped electrode patterns, and at least one identical basic pattern is formed on the opposite surface of the base member, the latter basic pattern being displaced relative to the former basic pattern by a distance equal to one-half of a basic pattern so that overlying electrode patterns are in reverse position whereby, on stacking a plurality of base members one on top of another with corresponding electrode patterns in engagement, a plurality of stacks of superposed electrode plates are provided in which alternate plates are in reverse position relative to one another.

It is another object of the invention to provide a method of making stacked capacitors wherein an assembly of stacked sheets is provided in which each sheet includes a plurality of identical capacitor units in juxtaposed relation, the units of one sheet being in superposed relation with corresponding units of the other sheets in the assembly so that, on cutting the assembly to divide the sheets between the units, a plurality of stacked capacitors is formed.

Still another object of the invention is to provide a method for making stacked capacitors which includes forming a plurality of capacitor units in a sheet so that each unit comprises a dielectric wafer having electrodes on opposite surfaces thereof, the electrodes being oriented in reverse position relative to one another.

It is further an object of the invention to provide a method of making stacked capacitors from a plurality of capacitor units, of the type including a wafer of dielectric material having electrodes on opposite surfaces thereof, the electrodes being spaced inwardly from the edges of the wafer and each electrically communicated to a different portion of the periphery of the wafer, in which the handling of individual wafers and capacitor units is eliminated.

Other objects and advantages of the invention will be apparent from the specification and claims when considered in connection with the attached sheet of drawings, illustrating one form of the invention, wherein like characters represent like parts and in which:

Figures 1, 2, 3, 4, 5, 6, 7:
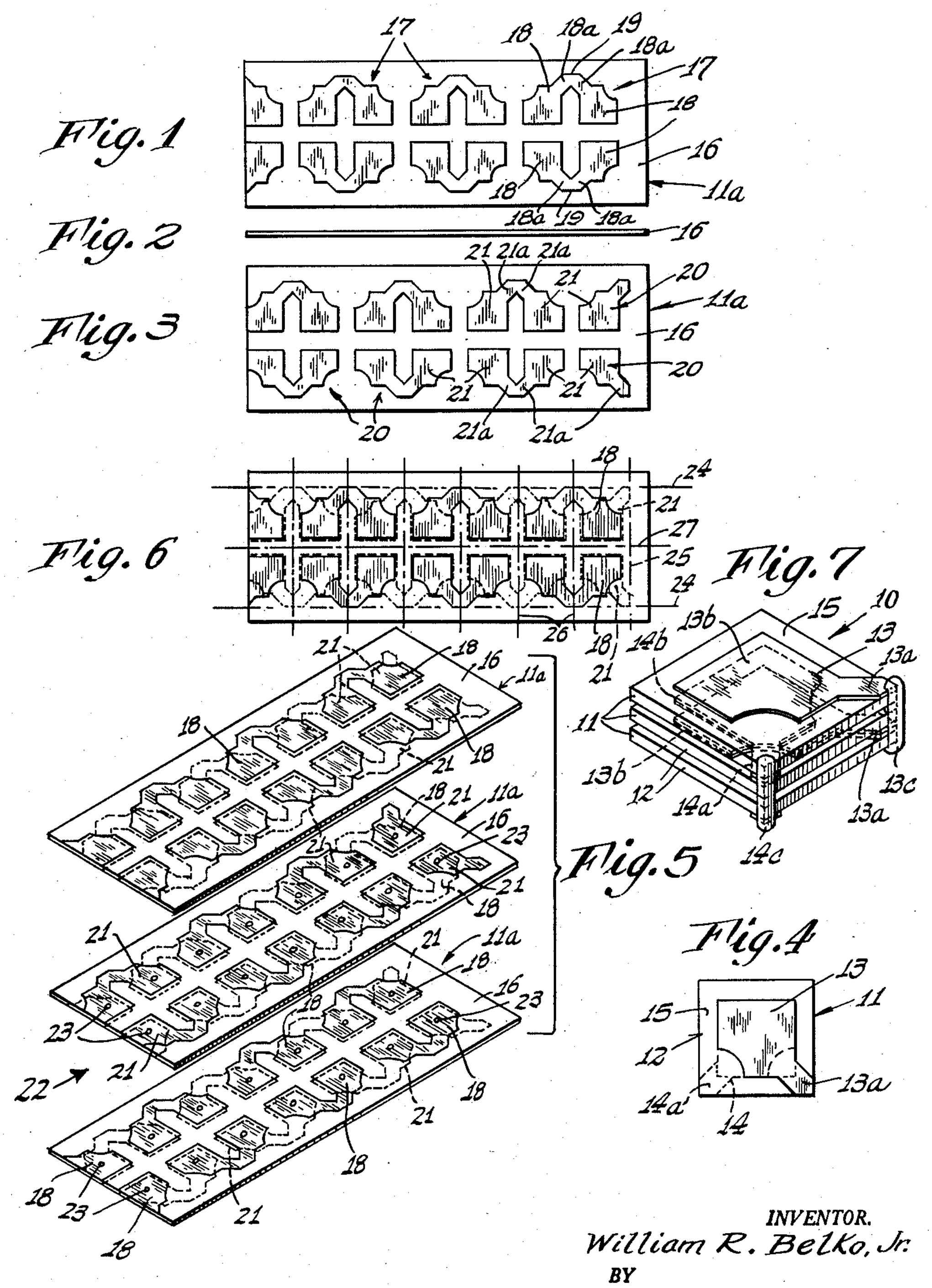
FIGURE 1 is a view of the top surface of a base member for use in making stacked capacitors according to the invention.
FIG. 2 is an edge view of the base member of FIG. 1.
FIG. 3 is a view of the bottom surface of the base member of FIG. 1.
FIG. 4 is a plan view of a capacitor unit for use in making stacked capacitors according to the invention.
FIG. 5 is an exploded perspective view of an assembly of base members for use in making stacked capacitors according to the invention.

FIG. 6 is a plan view of the assembly of FIG. 5, showing in solid and dotted lines the electrode patterns on opposite surfaces of the top base member in the assembly and showing by broken lines the manner in which the assembly is cut to separate the assembly into individual stacked capacitors; and FIG. 7 is a perspective view of a stacked capacitor made in accordance with the method of the invention.

Referring now to the drawings for a more detailed description of the invention, in FIG. 7 a stacked capacitor, made in accordance with the invention and generally indicated by the numeral 10, is shown including a plurality of capacitor units 11 bonded or otherwise held together to form the stack.

As illustrated in FIG. 4, each of the capacitor units 11 comprise a wafer 12 of dielectric material, such as a barium titanate ceramic or the like, having electrodes 13 and 14 on opposite surfaces thereof. The electrodes, which are in the form of electrically conductive areas of silver or similar conducting material, are formed in patterns of predetermined shape and size for providing the desired electrical characteristics in the finished capacitor. While the electrode patterns may be of any form which will produce the desired results, in the illustrated construction the patterns are of lesser area than the surfaces on which they are disposed, to provide a border 15 for eliminating short circuits around the edges of the wafers, and are provided with means in the form of an integral lead or terminal 13*a* or 14*a*, respectively, for electrically communicating the electrodes across the respective borders to the edge of the unit, for a purpose to be hereinafter explained. As will be seen, while the electrode patterns 13 and 14 are substantially superposed, the leads 13*a* and 14*a* extend therefrom in substantially opposite directions, so that the patterns are communicated to the edge of the unit at different portions of its periphery; in effect, electrodes on opposite surfaces of a wafer are in reverse position.

In the stacked assembly of the capacitor units 11, forming the stacked capacitor 10 shown in FIG. 7, the units are positioned so that the electrode patterns are superposed with corresponding electrode patterns 13—13 and 14—14 in engagement to form electrode plates 13*b* and 14*b*, respectively. The electrode plates, which correspond in shape and orientation to the electrode patterns from which they were formed, alternate in the stack so that alternate plates correspond and are electrically communicated to the edge of the stacked capacitor assembly at different portions of its periphery relative to the other plates. It should here be noted that, while the stacked capacitor 10 is shown comprising three capacitor units 11, there may be more units than three in the stack so long as there are always an uneven number. As a result of the uneven number of capacitor units forming the stack, the outer or end plates will differ relative to one another, with one end plate corresponding to plates 13*b* and the other end plate corresponding to plates 14*b*. As shown, alternate plates, along with their correspondingly oriented and shaped end plate, are electrically connected by leads 13*c* and 14*c* of electrically conductive material, through terminals 13*a* and 14*a* respectively. In some instances, if desired, lead wires, not shown, may be connected to the end plates or to the leads 13*c* and 14*c*.

According to the invention, in order to eliminate the problems inherent in prior art methods of making stacked capacitors, the capacitor units 11 which are used in building the stacked capacitor are formed in sheets 11*a* in juxtaposed relation and thereafter a plurality of such sheets are stacked and bonded together to form an assembly which is adapted to be cut apart to provide a plurality of individual stacked capacitors.

As shown in FIGS. 1 to 3, each sheet 11*a* of capacitor units is formed by providing a flat base member 16 of dielectric material, which may be in the form of a sheet or film of barium titanate ceramic or the like. On one surface of the base member at least one and preferably a plurality of repetitive basic patterns 17 of electrically conductive material are formed, each of such basic patterns comprising a plurality of predeterminately shaped electrode patterns 18, symmetrically arranged and spaced to form a border substantially completely around each of the electrode patterns. The patterns 18, which individually are adapted to form one of the electrodes of a capacitor unit, are each provided with a terminal portion 18*a* interrupting its respective border and extending to the outer edge thereof. The terminal portions 18*a* for each electrode pattern in one-half of the basic pattern extend outwardly of the basic pattern and into engagement with the terminal portion of the opposite corresponding electrode pattern, as shown at 19. On the opposite surface of base member 16 a plurality of basic patterns 20 of electrically conductive material are formed, corresponding in number to the basic patterns 17 on the other surface of the base member. The basic patterns 20 are identical to the basic patterns 17 and include a pluraltiy of predeterminately shaped electrode patterns 21, corresponding to the electrode patterns 18 and adapted to form the other electrode of the capacitor units. The electrode patterns 21 have terminal portions 21*a*, similar to the terminal portions 18*a* of patterns 18 and in the same relative location within the basic patterns. The basic patterns 20, while being identical to the basic patterns 17, are displaced relative thereto a distance equal to one-half of a basic pattern whereby overlying electrode patterns are in reverse position. To put it another way, the basic patterns 20 are displaced longitudinally of the base member 16, relative to the basic patterns 17, so that each electrode pattern 21 is in reverse position with respect to its superposed electrode pattern 18.

It should here be noted that accuracy in forming the electrode patterns on the base member, both as to shape, size and relative location, is critical with respect to the reliability of the finished capacitor units 11 and subsequently formed stacked capacitors 12. While the electrode patterns may be formed in any manner known to the art which provides absolute control over the size, shape and relative location of the patterns on opposite surfaces of the base member, it is preferred that the patterns be formed according to any of the methods disclosed in the copending application of William R. Belko, Jr., and Roger C. Vandermark, Serial Number 110,202, filed May 15, 1961.

At this point it should also be noted that, while the illustrated form of the invention is shown to include the step of forming basic patterns including a plurality of symmetrically arranged electrode patterns, it is within the scope of the invention to form a series of repetitive single electrode patterns on opposite surfaces of the base member, the electrode patterns on such opposite surfaces being displaced relative to one another one full electrode pattern, whereby overlying patterns are in reverse position.

After the sheets 11*a* of capacitor units have been formed, the sheets are stacked, one on top of another as shown in FIG. 5, with corresponding electrode patterns in electrical engagement to form an assembly 22. As shown, a bottom sheet 11*a* is positioned with the electrode patterns 18 facing upwardly and thereafter a second sheet 11*a* is positioned on top of the first sheet with its electrode patterns 18 facing downwardly for engagement with the corresponding electrode patterns of the first sheet. Subsequently added sheets are similarly oriented so that corresponding electrode patterns are in engagement. The positioning of the sheets to form the stacked assembly is critical in that any misalignment of electrode patterns wlil result in finished stacked capacitors which deviate from their predetermined electrical requirements. It should here be noted that, while only three sheets are shown in the assembly 22, any number of sheets may be employed so long as there are always an uneven number for the reasons explained above with respect to the stacked capacitors 10.

While the sheets in the assembly 22 may be bonded together in any manner known to the art so that engaging electrode patterns are electrically connected to form the electrode plates 13*b* and 14*b* of the finished stacked capacitors, it is preferred that during the stacking operation a small amount of electrically conductive material, preferably of the type utilized in forming the electrode patterns, be inserted between engaging electrode patterns, as shown at 23, and the assembly be fired to cause the material to electrically bond the patterns together. From a practical standpoint, this is best accomplished by placing a drop of the electrically conductive material in the center of each electrode pattern 18 on the bottom sheet 11*a* and in the center of each electrode pattern 21 on the next sheet and so forth as the sheets are stacked in the assembly. Thereafter the assembly is fired, as is well known in the art, to bond the sheets together.

After the assembly is formed, as above-described, it is trimmed, by any means known to the art, along the lines 24 and 25, as shown in FIG. 6 and then cut between the electrode patterns, as at 26 and 27, to separate the stacked capacitors into individual units 10. At this point the individual stacked capacitors are provided with the leads 13c and 14c for connecting the alternate plates to provide finished stacked capacitors. It should be noted that, if desired, the alternate plates of each stacked capacitor in the assembly may be electrically connected after trimming the assembly along lines 24 and 25 and before cutting the assembly into the separate stacked capacitors.

Thus, among others, the several objects and advantages of the invention as aforenoted are achieved. Obviously numerous changes in the method may be resorted to without departing from the spirit of the invention as defined in the claims.

I claim:

1. The method of making a stacked capacitor comprising the steps of providing a plurality of flat dielectric base members for use in forming a plurality of capacitor units, forming on one surface of each of said base members a plurality of identical spaced electrically conductive electrode patterns having an integral terminal portion extending outwardly therefrom and being oriented in the same direction relative to said base member, forming on the opposite surface of each of said base members a plurality of spaced electrically conductive electrode patterns being identical to said first electrode patterns but being oriented in reverse position relative to the base member so that the terminal portions of overlying electrode patterns extend in opposite directions, stacking said base members one on top of another with correspondingly oriented electrode patterns in electrical engagement to form an assembly, bonding the engaged corresponding electrode patterns together to form electrode plates having terminal portions in the assembly, cutting the assembly between electrode patterns to provide superposed electrode plates in stacked relation to form a plurality of stacked capacitors, said electrode plates each having a dielectric border therearound and having their respective terminal portions extending across their respective dielectric borders to the edges thereof, and electrically connecting the terminal portions of alternate electrode plates in each stacked capacitor.

2. The method of making a stacked capacitor comprising the steps of providing a plurality of flat dielectric base members for use in forming a plurality of capacitor units, forming on one surface of each of said base members at least one basic electrically conductive pattern comprising a plurality of predeterminately shaped electrode patterns symmetrically arranged, forming on the opposite surface of each of said base members at least one basic electrically conductive pattern being identical to said first basic pattern and being displaced relative thereto a distance equal to one-half the basic pattern whereby overlying electrode patterns are in reverse position, stacking said base members one on top of another with corresponding electrode patterns in electrical engagement to form an assembly, bonding the engaged corresponding electrode patterns together to form electrode plates in the assembly, cutting the assembly to divide the basic pattern between the electrode patterns to provide superposed electrode plates in stacked relation to form a plurality of stacked capacitors, and electrically connecting alternate electrode plates in each stacked capacitor.

3. The method of making a stacked capacitor comprising the steps of providing a plurality of flat dielectric base members for use in forming a plurality of capacitor units, forming on one surface of each of said base members at least one basic electrically conductive pattern comprising a plurality of predeterminately shaped electrode patterns symmetrically arranged, forming on the opposite surface of each of said base members at least one basic electrically conductive pattern being identical to said first basic pattern and being displaced relative thereto a distance equal to one-half the basic pattern whereby overlying electrode patterns are in reverse position, stacking said base members one on top of another with corresponding electrode patterns in engagement to form an assembly, inserting electrically conductive material between engaged corresponding electrode patterns for electrically connecting the same, firing the assembly for bonding the engaged corresponding electrode patterns together to form electrode plates in the assembly, cutting the assembly to divide the basic pattern between the electrode patterns to provide superposed electrode plates in stacked relation to form a plurality of stacked capacitors, and electrically connecting alternate electrode plates in each stacked capacitor.

4. The method of making a stacked capacitor comprising the steps of providing a plurality of flat dielectric base members for use in forming a plurality of capacitor units, forming at least one basic electrically conductive pattern on one surface of each of said base members, said basic pattern comprising a plurality of predeterminately shaped electrode patterns symmetrically arranged and spaced to form a border substantially completely around each of said electrode patterns, said electrode patterns each being formed with a terminal portion interrupting its respective border and extending to the other edge thereof, said terminal portion for each electrode pattern in one-half of said basic pattern extending outwardly of the basic pattern and into engagement with the terminal portion of the opposite corresponding electrode pattern in the other half of the basic pattern, forming at least one basic electrically conductive pattern on the opposite surface of each of said base members, said second basic pattern being identical to said first basic pattern and being displaced relative thereto a distance equal to one-half the basic pattern whereby overlying electrode patterns are in reverse position and their respective terminal portions extend in opposite directions, stacking said base members one on top of another with corresponding electrode patterns in engagement to form an assembly, bonding the engaged corresponding electrode patterns together to form electrode plates having terminal portions in the assembly, cutting the assembly to divide the basic pattern between the electrode patterns to form superposed bordered electrode plates in stacked relation to form a plurality of stacked capacitors and electrically connecting terminal portions of alternate electrode plates in each stacked capacitor.

5. The method of making a stacked capacitor comprising the steps of providing a plurality of flat dielectric base members for use in forming a plurality of capacitor units, forming on one surface of each of said base members a plurality of repetitive electrically conductive basic patterns each comprising a plurality of predeterminately shaped electrode patterns symmetrically arranged, forming on the opposite surface of each of said base members a plurality of repetitive electrically conductive basic patterns each being identical to said first basic patterns and being displaced relative thereto a distance equal to one-half the basic pattern whereby overlying electrode patterns are in reverse position, stacking said base members one on top of another with corresponding electrode patterns in engagement to form an assembly, bonding the engaged corresponding electrode patterns together to form electrode plates in the assembly, cutting the assembly to divide the basic patterns between their respective electrode patterns to provide superposed electrode plates in stacked relation to form a plurality of stacked capacitors and electrically connecting alternate electrode plates in each stacked capacitor.

6. The method of making a stacked capacitor comprising the steps of providing an uneven number of flat dielectric base members for use in forming a plurality of capacitor units, forming on one surface of each of said base members at least one electrically conductive basic pattern comprising a plurality of predeterminately shaped electrode patterns symmetrically arranged, forming on the opposite surface of each of said base numbers at least one electrically conductive basic pattern being identical to said first basic pattern and being displaced relative thereto a distance equal to one-half the basic pattern whereby overlying electrode patterns are in reverse position, stacking said base members one on top of another with corresponding electrode patterns in engagement to form an assembly in which the outer electrode patterns of the assembly are in reverse position relative to one another, bonding the engaged corresponding electrode patterns together electrically to form electrode plates in the assembly, cutting the assembly to divide the basic pattern between the electrode patterns to provide superposed electrode plates in stacked relation to form a plurality of stacked capacitors and electrically connecting alternate electrode plates in each stacked capacitor.

7. The method of making a stacked capacitor comprising the steps of providing three flat dielectric base members for use in forming a plurality of capacitor units, forming on one surface of each of said base members at least one electrically conductive basic pattern comprising a plurality of predeterminately shaped electrode patterns symmetrically arranged, forming on the opposite surface of each of said base members at least one electrically conductive basic pattern being identical to said first basic pattern and being displaced relative thereto a distance equal to one-half the basic pattern whereby overlying electrode patterns are in reverse position, stacking said base members one on top of another with corresponding electrode patterns in electrical engagement to form an assembly having the outer electrode patterns in reverse position relative to one another, bonding the engaged corresponding electrode patterns together to form electrode plates in the assembly, cutting the assembly to divide the basic pattern between the electrode patterns to provide superposed electrode plates in stacked relation to form a plurality of stacked capacitors and electrically connecting alternate electrode plates in each stacked capacitor.

References Cited in the file of this patent

UNITED STATES PATENTS 2,389,420 Deyrup ---------------- Nov. 20, 1945
2,608,601 Boardman -------------- Aug. 26, 1952

UNITED STATES PATENT OFFICE

CERTIFICATE OF CORRECTION

Patent No. 3,117,365 January 14, 1964

William R. Belko, Jr.

It is hereby certified that error appears in the above numbered patent requiring correction and that the said Letters Patent should read as corrected below.

Column 3, line 11, for "circuts" read -- circuits --; column 4, line 4, for "pluraltiy" read -- plurality --; line 54, for "wlil" read -- will --; column 6, line 30, for "other" read -- outer --; column 7, line 7, for "numbers" read -- members --.

Signed and sealed this 9th day of June 1964.

(SEAL)
Attest:

ERNEST W. SWIDER
Attesting Officer

EDWARD J. BRENNER
Commissioner of Patents